United States Patent
Takemori et al.

(10) Patent No.: US 7,193,268 B2
(45) Date of Patent: Mar. 20, 2007

(54) SEMICONDUCTOR DEVICE

(75) Inventors: Toshiyuki Takemori, Saitama (JP); Fuminori Sasaoka, Saitama (JP); Yuji Watanabe, Saitama (JP)

(73) Assignee: Shindengen Electric Manufacturing Co., Ltd, Saitama (JP)

( * ) Notice: Subject to any disclaimer, the term of this patent is extended or adjusted under 35 U.S.C. 154(b) by 0 days.

(21) Appl. No.: 11/033,734

(22) Filed: Jan. 13, 2005

(65) Prior Publication Data
US 2006/0151828 A1     Jul. 13, 2006

(51) Int. Cl.
*H01L 29/732* (2006.01)
(52) U.S. Cl. ............... 257/327; 257/328; 257/E27.096
(58) Field of Classification Search ........ 257/327, 257/328, 329, 330, 331, 341, 342, E27.096
See application file for complete search history.

(56) References Cited

U.S. PATENT DOCUMENTS 6,060,731 A * 5/2000 Murata et al. ............ 257/139
6,838,735 B1 * 1/2005 Kinzer et al. ............ 257/365

FOREIGN PATENT DOCUMENTS

JP    11-045998 A    2/1999
JP    2000-223708 A    8/2000

OTHER PUBLICATIONS

Tsutomu Uesugi et al., "A New Power MOSFET having Excellent Avalanche Capability," ISPSO'2000, May 22-25, Toulouse, France, pp. 349-352, IEEE (May 2000).

* cited by examiner

*Primary Examiner*—Minhloan Tran
*Assistant Examiner*—Benjamin Tzu-Hung Liu
(74) *Attorney, Agent, or Firm*—Rader, Fishman & Grauer PLLC; Toshikatsu Imaizumi

(57) ABSTRACT

In a semiconductor device in which gate trenches and source trenches are formed, when the semiconductor device is flatly viewed, $N^+$ type source areas are formed in parallel with the gate trenches to ease the miniaturization of the semiconductor device. $P^+$ type diffusion areas are separately formed in a direction orthogonal to the $N^+$ type source areas and the gate trenches. Thus, the $N^+$ type source areas and a P type body layer are formed in a laminated state, but the $P^+$ type diffusion areas are not laminated. Therefore, the structure of a mesa section is extremely simple. Furthermore, gate electrode films are connected to one another by a connection member. Thus, the semiconductor device has such a structure as to easily secure electric connection to each gate electrode film from outside. According to the foregoing structure, it is possible to extremely ease the miniaturization of the semiconductor device.

6 Claims, 11 Drawing Sheets

SEMICONDUCTOR DEVICE

FIELD OF THE INVENTION

The present invention relates to a semiconductor device, and in particular, to a semiconductor device having the structure of a power MOSFET that is mainly used in a power supply circuit and the like.

BACKGROUND OF THE APPLICATION

A semiconductor device having the structure of a power MOSFET, in which gate trenches and source trenches are formed, has been widely applied in recent years to various power supplies such as DC—DC converters. FIG. 11 shows an example of such a semiconductor device. FIG. 11 is a sectional view showing an example of a semiconductor device according to conventional technology. In FIG. 11, a semiconductor device 300 comprises an $N^+$ type drain layer 301, an $N^-$ type drift layer 302, a P type body layer 303, $P^+$ type diffusion areas 304, a source electrode film 305, gate insulating films 306, gate electrode films 307, a drain electrode film 309, gate trenches 311, $N^+$ type source areas 312, source trenches 313, an insulating film 319, and a PSG film 320. "W" refers to the width of the mesa.

To form the semiconductor device 300, the $N^-$ type drift layer 302 is laminated on the $N^+$ type drain layer 301, and then the P type body layer 303 and the $N^+$ type source area 312 are laminated on the $N^-$ type drift layer 302. The gate trenches 311 are formed so as to extend from the surface of the $N^+$ type source area 312 to the $N^-$ type drift layer 302. Furthermore, the source trenches 313 are formed so as to extend from the surface of the $N^+$ type source area 312 to the P type body layer 303. The gate trenches 311 and the source trenches 313 are alternately disposed in parallel with each other. The gate insulating film 306 is formed in the bottom and side faces of the gate trench 311. The gate insulating film 306 makes contact with the P type body layer 303 and the $N^+$ type source areas 312. The gate electrode film 307 is formed on the inner surface of the gate insulating film 306 in such a manner as to charge the space, surrounded by the gate insulating film 306. The gate electrode film 307 is electrically insulated from the P type body layer 303 and the $N^+$ type source areas 312 by the gate insulating film 306.

In addition, the insulating film 319 is formed so as to cover the surfaces of the gate insulating films 306, the gate electrode films 307, and the $N^+$ type source areas 312. Furthermore, the surface of the insulating film 319 is covered with the PSG (phospho-silicate glass) film 320. The source electrode film 305 is formed on the inner surfaces of the source trenches 313 and the surface of the PSG film 320. The source electrode film 305 makes contact with the $N^+$ type source areas 312 and the $P^+$ type diffusion areas 304. The drain electrode film 309 is formed on the surface of the $N^+$ type drain layer 301 on which the $N^-$ type drift layer 302 is not formed.

In the semiconductor device 300, when a voltage is applied between the source electrode film 305 and the drain electrode film 309, and a voltage having a threshold value or more is applied between the gate electrode film 307 and the source electrode film 305, inversion layers are formed in the vicinity of the borders between the P type body layer 303 and the gate insulating films 306. The inversion layers become channels. Electric current flows from the drain electrode film 309 to the source electrode film 305 through these channels. On the other hand, when the voltage applied between the gate electrode film 307 and the source electrode film 305 is reduced to the threshold value or less, on the other hand, the channels disappear. Then, the electric current ceases to flow between the source electrode film 305 and the drain electrode film 309.

Since the source trenches 313 are formed in the semiconductor device 300, as described above, the $N^+$ type source areas 312 are electrically connected to the source electrode film 305 inside the source trenches 313. Thus, consideration of the design, by which a certain degree of the area of the top faces (surfaces) of the $N^+$ type source areas 312 has to be secured for connection with the source electrode film 305, becomes unnecessary. Also, since the $P^+$ type diffusion areas 304 are formed in the P type body layer 303, there is the advantage that the area of the top faces of the $N^+$ type source areas 312 can be reduced as compared with a case where the $P^+$ type diffusion areas 304 are formed on the surfaces of the $N^+$ type source areas 312 by diffusion. Such a semiconductor device is disclosed in Japanese Patent Laid-Open Publication No. 2000-223708.

To miniaturize such a semiconductor device, it is necessary to reduce the width of mesa "W." When, for example, the width of mesa "W" is reduced to 0.5 μm or less, the $P^+$ type diffusion area 304 tends to make contact with the gate trench 311. This is a consequence of the precision of semiconductor production equipment for forming the source trenches 313 and the $P^+$ type diffusion areas 304, this being equipment such as that used in a photographic process. Such a semiconductor device cannot be used since it exhibits electric characteristics, which a designer does not plan. Therefore, this problem related to the width of mesa "W" has become a significant factor preventing the miniaturization of such semiconductor devices.

Considering the foregoing circumstances, an object of the present invention is to provide a semiconductor device, in which gate trenches and source trenches are formed, having an easily miniaturized structure.

SUMMARY OF THE INVENTION

To solve the foregoing problems, a semiconductor device according to the present invention comprises: a first conductive layer of a first conductive type, a second conductive layer of the first conductive type laminated on the first conductive layer, a third conductive layer of a second conductive type opposite to the first conductive type, the third conductive layer being laminated on the second conductive layer, a fourth conductive layer of the first conductive type laminated on the third conductive layer, a plurality of grooves formed in parallel with each other so as to extend from the surface of the fourth conductive layer to the second conductive layer through the fourth and third conductive layers, a plurality of conductive areas of the second conductive type formed on the third conductive layer in a direction across the grooves in the shape of a strip so as to make contact with end portions of the fourth conductive area and the groove, first insulating films formed on the side faces and bottom face of each of the grooves, gate electrode films formed on the surfaces of the first insulating films, second insulating films formed on the gate electrode films, a conductive film connected to the gate electrode films through openings formed in the second insulating films so as to be across the grooves, a third insulating film formed so as to cover the conductive film, a source electrode film formed on the surfaces of at least the fourth conductive layer and the conductive areas, and a drain electrode film formed on the surface of the first conductive layer.

Accordingly, since the plurality of conductive areas of the second conductive type are formed in the direction across the grooves, almost all sections surrounded by these conductive areas and the grooves can be assigned as the fourth conductive layer. In other words, it is possible to simplify the structure of a section interposed between the grooves, so that the miniaturization of this section becomes easy.

Another semiconductor device according to the present invention comprises: a first conductive layer of a first conductive type, a second conductive layer of the first conductive type laminated on the first conductive layer, a third conductive layer of a second conductive type opposite to the first conductive type, the third conductive layer being laminated on the second conductive layer, a fourth conductive layer of the first conductive type laminated on the third conductive layer, a plurality of second grooves formed so as to extend in a direction across first grooves from the surface of the fourth conductive layer to the third conductive layer through the fourth conductive layer, separately from the first grooves, conductive areas of the second conductive type formed so as to be exposed from at least the bottom faces of the second grooves, first insulating films formed on the side faces and bottom face of the first groove, gate electrode films formed on the surfaces of the first insulating films, second insulating films formed on the gate electrode films, a conductive film connected to the gate electrode films through openings formed in the second insulating films, so as to be across the first grooves, a third insulating film formed so as to cover the conductive film, a source electrode film formed at least on the surface of the fourth conductive layer, and on the side faces and bottom faces of the second grooves, and a drain electrode film formed on the surface of the first conductive layer.

Accordingly, the first grooves are formed across the second grooves, and different conductive layers or areas are exposed from the surfaces of these grooves. Therefore, it is possible to assign almost all sections surrounded by the first grooves and the second grooves as the fourth conductive layer.

In the foregoing aspects of the invention, the gate electrode film may be electrically connected to the adjacent different gate electrode film by a connection member, which is formed above the fourth conductive layer and is electrically insulated from the source electrode film. The connection member may be electrically insulated from the source electrode film by the gate insulating films. Furthermore, in the foregoing aspects of the invention, a conductive area for easing an electric field may be formed between the second conductive layer and the third conductive layer, so as to cover the corners of the first grooves. In addition, it is also possible to laminate a fifth conductive layer of the second conductive type on the surface of the first conductive layer opposite to the second conductive layer.

According to the present invention, since the plurality of conductive areas of the second conductive type are formed across the grooves, so that it is possible to assign almost all sections surrounded by these conductive areas and the grooves as a single conductive layer. Therefore, the structure of this section is simplified, and hence the miniaturization of the semiconductor device becomes easy. Also there is the advantage that the introduction of expensive semiconductor production equipment is unnecessary for miniaturizing the semiconductor device.

The first grooves are formed across the second grooves, and the different conductive layers or areas are exposed from the surfaces of these grooves. Thus, it is possible to assign almost all sections surrounded by the first grooves and the second grooves as a single conductive layer. Therefore, the structure of this section is simplified, and hence the miniaturization of the semiconductor device becomes easy.

DETAILED DESCRIPTION OF THE INVENTION

One feature of the present invention is that a source area and a P type body layer are disposed in a mesa section sandwiched between gate trenches, while a P type diffusion area is disposed in a section other than the mesa section. Another feature of the present invention is that a connection member is formed so as to intersect with the gate trenches, and gate electrode films are connected to each other by connecting the gate electrode films and upper gate electrode films, which are disposed under the connection member, to the connection member. Still another feather of the present invention is that a P type area, for easing an electric field, is formed so as to cover the corners of the gate trenches. This is for the purpose of easing electric field intensity in the vicinity of the corners of the gate trenches. The present invention will be hereinafter described in detail on the basis of illustrated embodiments.

Figure 1:
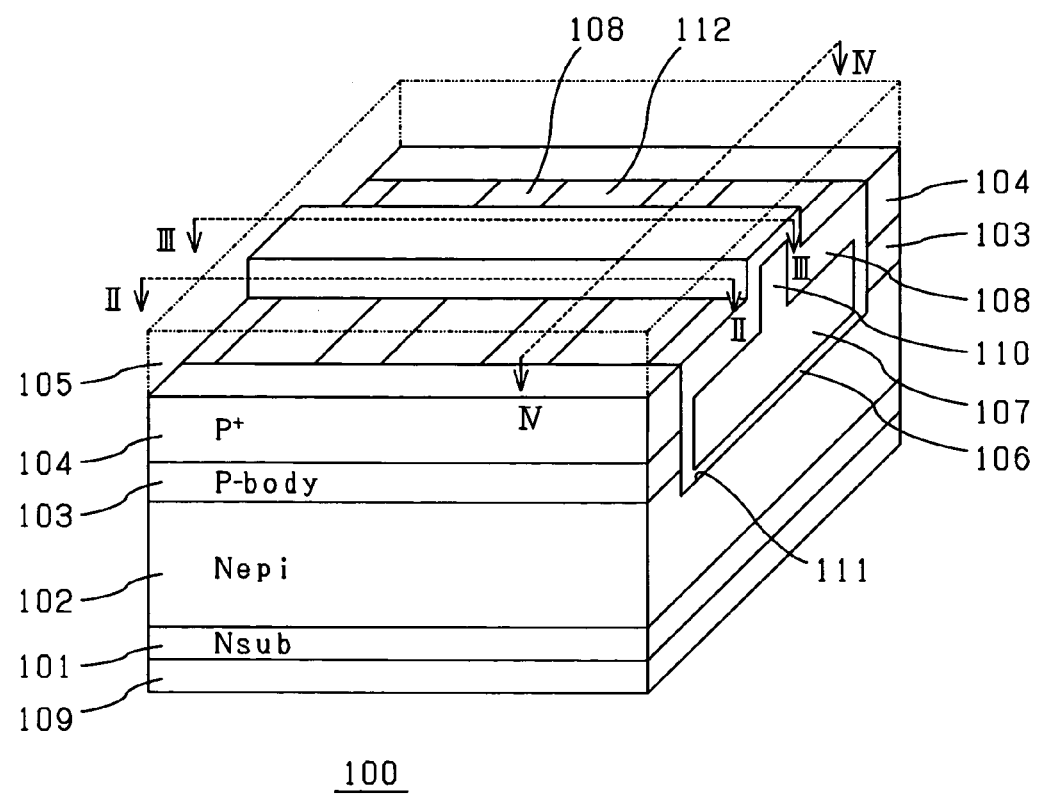
FIG. 1 is a perspective view of a semiconductor device according to a first embodiment of the present invention.

FIG. 1 is a perspective view of a semiconductor device according to a first embodiment of the present invention. Referring to FIG. 1, a semiconductor device 100 comprises an $N^+$ type drain layer 101, an $N^-$ type drift layer 102, a P type body layer 103, $P^+$ type diffusion areas 104, a source electrode film 105, gate insulating films 106, gate electrode films 107, upper gate insulating films 108, a drain electrode film 109, upper gate electrode films 110, gate trenches 111, and $N^+$ type source areas 112. For convenience of explanation, the source electrode films 105 and 205 are transparently illustrated in FIG. 1 and FIGS. 2 to 9 described later, to show the structure existing below the source electrode films 105 and 205. The following explanation will be predicated on this state.

In the semiconductor device 100, the $N^-$ type drift layer 102 is laminated on the $N^+$ type drain layer 101, and the P type body layer 103 is formed on the $N^-$ type drift layer 102. Furthermore, the $P^+$ type diffusion areas 104 are formed on the P type body layer 103. The $N^+$ type drain layer 101 is a silicon substrate, which contains a high concentration of N type impurities. The N⁻ type drift layer 102 is an N type silicon layer with a low impurity concentration, and which is formed on the silicon substrate by epitaxial growth. The P type body layer 103 is formed by selectively implanting P type impurities on the surface of the N⁻ type drift layer 102, and diffusing the impurities in a range from the surface to a predetermined depth at high temperature. The P⁺ type diffusion areas 104 are also formed by the implantation and diffusion of the P type impurities.

To be more specific, it is preferable that the resistivity of the N⁺ type drain layer 101 should be 0.003 Ω·cm, and the resistivity of the N⁻ type drift layer 102 be from 0.3 to 2.3 Ω·cm, in the structure of the present invention. It is preferable that the surface concentration of the P type body layer 103 be approximately 1E18 atoms/cm², and the surface concentration of the P⁺ type diffusion area 104 be approximately 5E19 atoms/cm², and the surface concentration of the N⁺ type source area 112, which will be described below, be approximately 1E20 atoms/cm². However, this is only one example, and the impurity concentration can be altered in accordance with design conditions. Methods for forming these conductive layers and diffusion areas are not limited to the foregoing examples. Other methods are available as long as the same structure can be formed.

Figure 2:
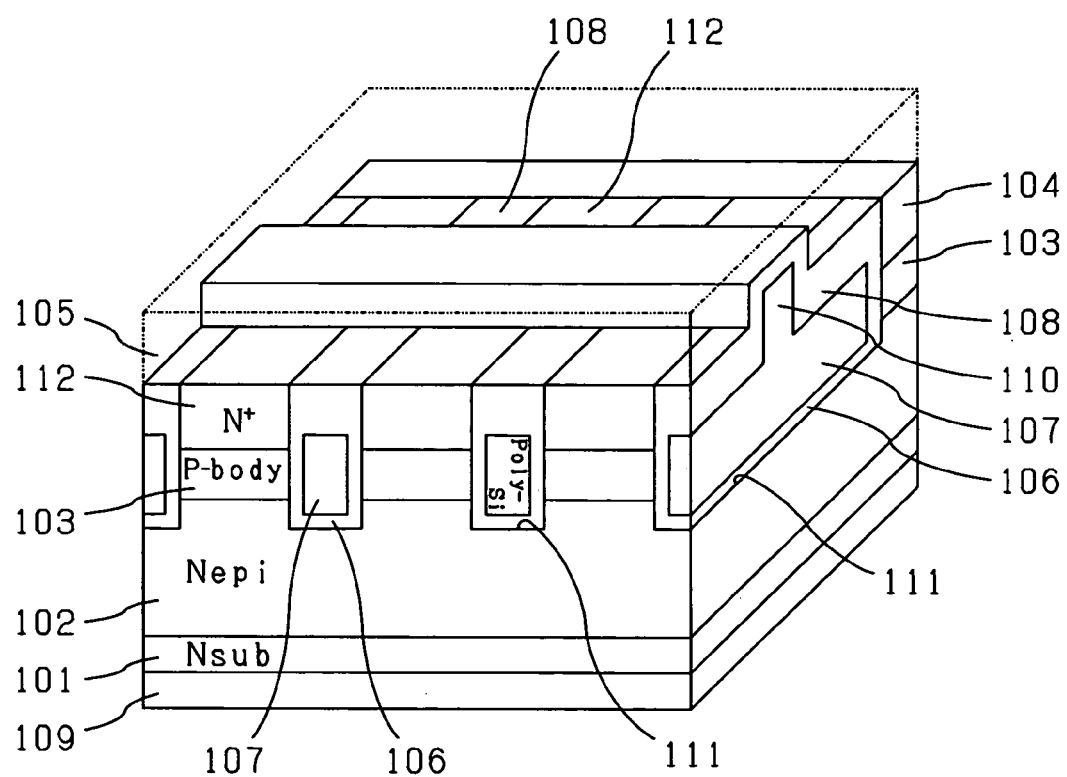
FIG. 2 is a sectional perspective view of the semiconductor device shown in FIG. 1 taken along the line II—II.

FIG. 2 is a sectional perspective view of the semiconductor device shown in FIG. 1 taken along the line II—II. The reference numbers in FIG. 2 refer to the same components as shown in FIG. 1. Referring to FIG. 2, many gate trenches 111 are formed in parallel with one another between the P type body layer 103 and the P⁺ type diffusion areas 104. The gate trench 111 is formed by opening the surface of the N⁺ type source area 112 by etching. The bottom of the gate trench 111 reaches the N⁻ type drift layer 102 beyond the boundary surface between the P type body layer 103 and the N⁻ type drift layer 102. Both ends of the gate trench 111, as shown in FIG. 1, is in contact with the P⁺ type diffusion areas 104. When the semiconductor device 100 is flatly viewed, in other words, when the semiconductor device 100 is looked down on from above, each of the gate trenches 111 is formed so as to be sandwiched between the P⁺ type diffusion areas 104.

It is preferable that the gate trench 111 have a depth as shown in FIG. 2, but the depth of the gate trench 111 can be altered as necessary. When, for example, it is required that capacitance $C_{rss}$ be much smaller with respect to the semiconductor device 100, the gate trench 111 may be formed more shallowly than the boundary surface between the N⁻ type drift layer 102 and the P type body layer 103 so as to reduce the capacitance $C_{rss}$. When it is required that the on-resistance $R_{on}$ be much smaller, on the other hand, the gate trench 111 may be formed more deeply than the boundary surface between the N⁺ type drain layer 101 and the N⁻ type drift layer 102 so as to reduce the on-resistance $R_{on}$.

The gate insulating film 106 is formed on the surface of the gate trench 111. The gate insulating film 106 is formed by laminating a silicon oxide film in an oxygen atmosphere at high temperature. As a matter of course, the silicon oxide film can be formed by a CVD method. Furthermore, the gate electrode film 107 is charged into the internal space surrounded by the gate insulating film 106. The gate electrode film 107 is formed by laminating (forming) polysilicon containing N type impurities, but silicide or metal may be charged instead of polysilicon. The upper gate electrode film 110 may be made of the same material as that of the gate electrode film 107, or may be made of another material. To prevent increase in the number of processes, it is preferable to form the upper gate electrode films 110 by the same process as that for the gate electrode films 107, though the upper gate electrode films 110 may be made by a different process.

The upper gate insulating film 108 is formed over the gate insulating film 106, the gate electrode film 107, and the upper gate electrode film 110. The upper gate insulating film 108 is formed so as to cover a connection member, which will be described later. A part of the upper gate insulating film 108 protrudes upward from the surface of the N⁺ type source area 112. The method for forming the upper gate insulating films 108 can be the same as that of the gate insulating films 106, though the upper gate insulating films 108 can be formed by combining a plurality of silicon oxide films. Various processes for forming the gate insulating films 106 and the upper gate insulating films 108 are considered within the scope of the present invention. Any process is considered available as long as the shape and structure shown in FIG. 1 are obtained. For example, a part of the gate insulating film 106 and a part of the upper gate insulating film 108 may be formed by a common process. It is also possible to make one or both of the gate insulating film 106 and the upper gate insulating film 108 may be made of a silicon nitride.

The N⁺ type source area 112 is formed between the gate trenches 111. When the semiconductor device 100 is flatly viewed, the N⁺ type source areas 112 and the upper gate insulating films 108 are alternately disposed, and generally form a stripe pattern. The P⁺ type diffusion areas 104 and the upper gate insulating films 108, which are formed over the upper gate electrode films 110, are alternately disposed at regular intervals intersecting with the stripe pattern. When the semiconductor device 100 is flatly viewed, it is possible to arrange many N⁻ type source areas 112 and upper gate insulating films 108 on the left, right, top, and bottom. In this case, many upper gate insulating films 108 are also arranged at predetermined intervals.

Although the source electrode film 105 is described as if it is transparent in the foregoing description, the P⁺ type diffusion areas 104, the upper gate insulating films 108, and the N⁺ type source areas 112 are actually covered with the source electrode film 105. Thus, the top faces of the P⁺ type diffusion areas 104 and the N⁺ type source areas 112 are electrically connected to the source electrode film 105. The surface of the N⁺ type drain layer 101 on which the N⁻ type drift layer 102 is not formed, is covered with the drain electrode film 109. As a matter of course, the N⁺ type drain layer 101 is electrically connected to the drain electrode film 109.

Figure 3:
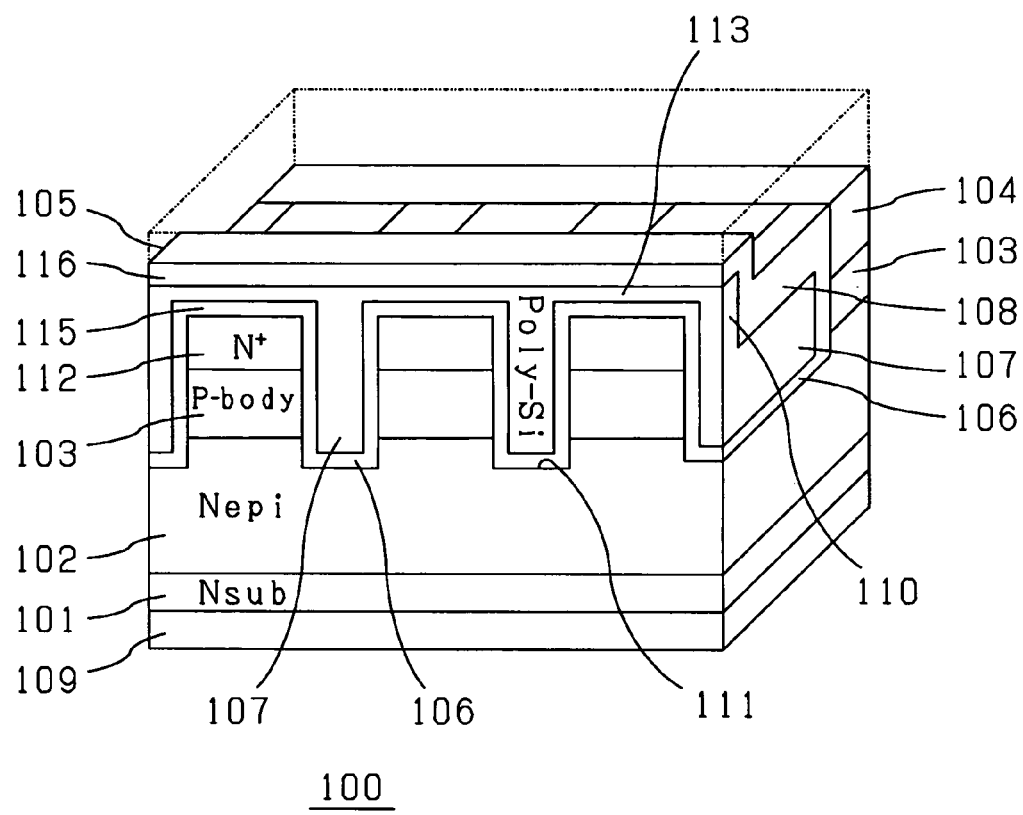
FIG. 3 is a sectional perspective view of the semiconductor device shown in FIG. 1 taken along the line III—III.
Figure 10:
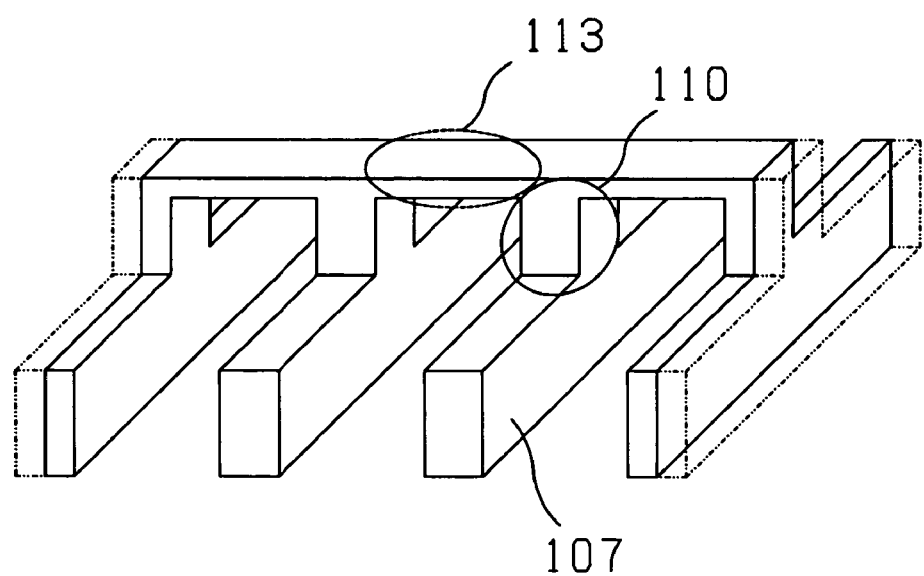
FIG. 10 is a perspective view of a gate electrode film of the semiconductor device shown in FIG. 1.

FIG. 3 is a sectional perspective view of the semiconductor device shown in FIG. 1 taken along the line of III—III. In FIG. 3, the reference number 113 refers to the connection member, and the reference numbers 115 and 116 refer to interlayer insulating films. All the other reference numbers refer to the same components as those shown in FIG. 1. FIG. 10 is a perspective view of the gate electrode films of the semiconductor device shown in FIG. 1. In FIG. 3, all of the reference numbers refer to the same components as shown in FIG. 1. As shown in FIGS. 3 and 10, upper gate electrode films 110 are connected to one another by the common connection member 113. The connection member 113 is covered with and sandwiched between the interlayer insulating films 115 and 116 except for a predetermined portion. Thus, the connection member 113 is formed so as to intersect with the N⁺ type source areas 112, but is insulated from the N⁺ type source areas 112. Furthermore, the connection member 113 is also insulated from the source electrode film 105. Accordingly, if, for example, electric connection to the outside is secured in a not-illustrated portion of the connection member 113, it becomes possible to electrically connect all of the gate electrode films 107, and the upper gate electrode films 110, to the outside. Therefore, it is possible to adopt a trench gate structure.

One electric connection to the connection member 113 is secured per connection member 113, but two or more electric connections may be secured in accordance with the magnitude of the resistance component of the connection member 113 and the upper gate electrode films 110. Any of the gate electrode films 107 may be used for an electric connection to the outside, and the connection member 113 may not be used for the electric connection to the outside. Furthermore, when the two or more connection members 113 are formed, the connection members 113 may be connected to each other, and the electric connection may be secured to any one of the connection members 113.

Figure 4:
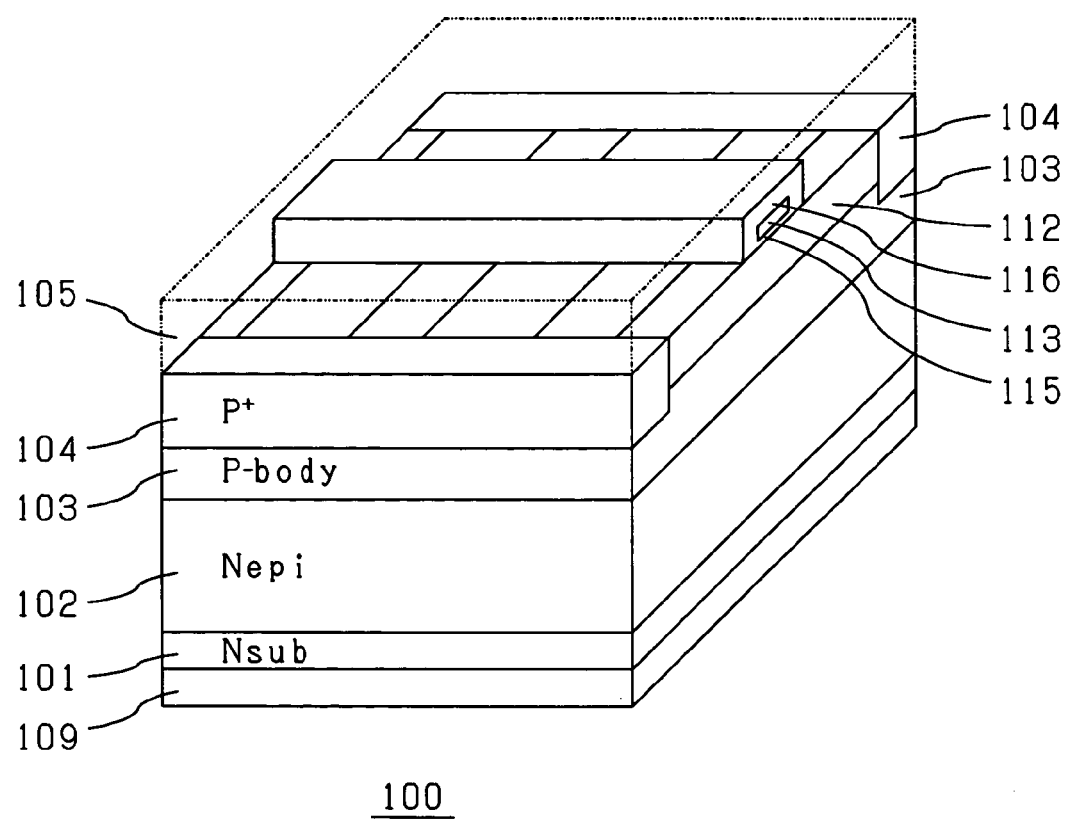
FIG. 4 is a sectional perspective view of the semiconductor device shown in FIG. 1 taken along the line VI—VI.

FIG. 4 is a sectional perspective view of the semiconductor device shown in FIG. 1 taken along the line of IV—IV. In FIG. 4, all the reference numbers refer to the same components as those shown in FIGS. 1 and 3. Referring to FIG. 4, the periphery of the connection member 113 is covered with the interlayer insulating film 116 on the N$^+$ type source areas 112, and is insulated from the N$^+$ type source areas 112 as described above. The interlayer insulating film 116 is made of a plurality of silicon oxide films. The interlayer insulating film 116, however, is formed by any process as long as the shape and structure substantially as shown in FIG. 4 are obtained.

In the foregoing structure, when a voltage is applied between the source electrode film 105 and the drain electrode film 109, and a voltage of a threshold value or more is applied between the gate electrode film 107 and the source electrode film 105, inversion layers are formed in the vicinity of borders between the P type body layer 103 and the gate insulating films 106. The inversion layers become channels. Then, electric current flows from the drain electrode film 109 to the source electrode 105 through the channels. When the voltage between the gate electrode film 107 and the source electrode film 105 is reduced to less than the threshold value, the channels disappear, so that electric current ceases to flow between the drain electrode film 109 and the source electrode film 105.

Figure 11:
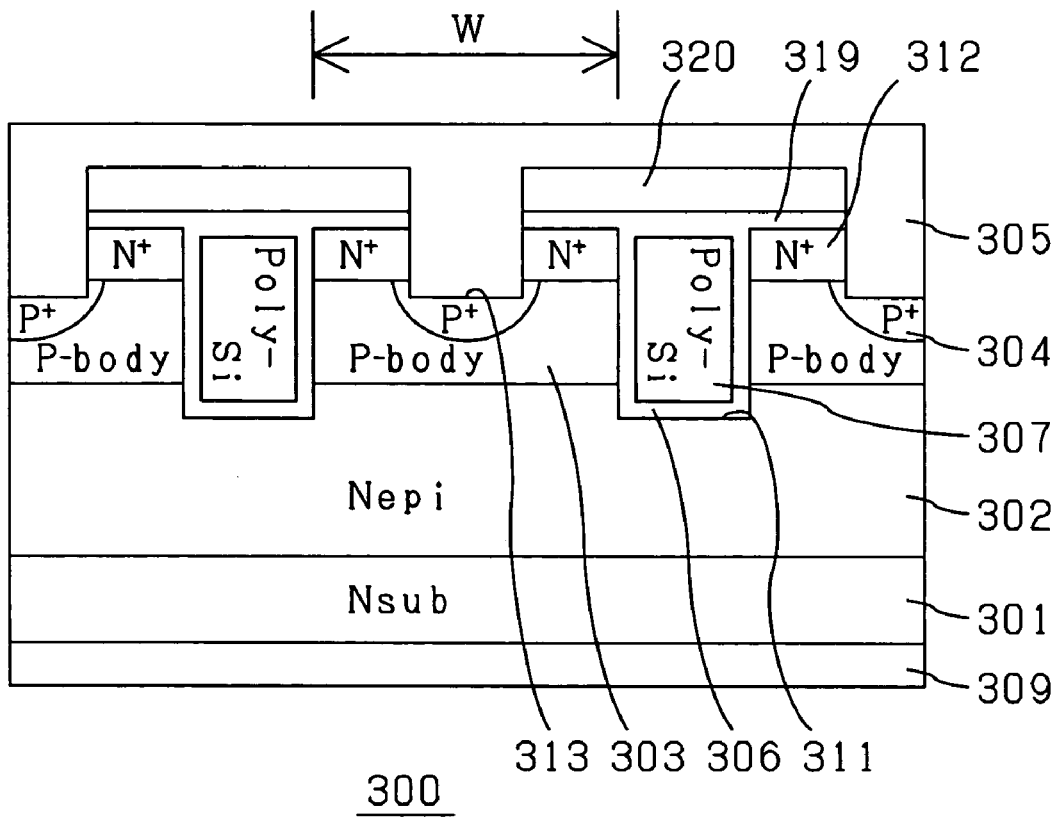
FIG. 11 is a sectional view of an example of a semiconductor device according to actual conventional technology.

By the way, in the semiconductor device 100 according to the first embodiment of the present invention, the N$^+$ type source areas 112 are formed in parallel with the gate trenches 111, and the P$^+$ type diffusion areas 104 are separately formed in an orthogonal direction to the N$^+$ type source areas 112 and the gate trenches 111, when the semiconductor device 100 is flatly viewed. In other words, the N$^+$ type source area 112 and the P type body layer 103, which are laminated with each other, are formed in the mesa sections between the gate trenches 111 at predetermined intervals in a stripe pattern, but the P$^+$ type diffusion area 104 is not formed therein. Accordingly, when the semiconductor device 100 is compared with the semiconductor device shown in FIG. 11 according to conventional technology, the structure of the mesa section is extremely simple. The extremely simple structure of the mesa section makes it possible to significantly reduce problems associated with the miniaturization of the semiconductor device 100. Furthermore, the gate electrode films 107 are connected to one another by the connection member 113. Therefore, the semiconductor device 100 has such a structure as to easily secure, from the outside, an electric connection to each gate electrode film 107. In addition, the connection member 113 is covered with the interlayer insulating films 115 and 116 so as to be completely insulated from the source electrode film 105. Therefore, all exposed portions of the N$^+$ type source areas 112 and the P$^+$ type diffusion areas 104 are available as contact areas to the source electrode film 105.

Figure 5:
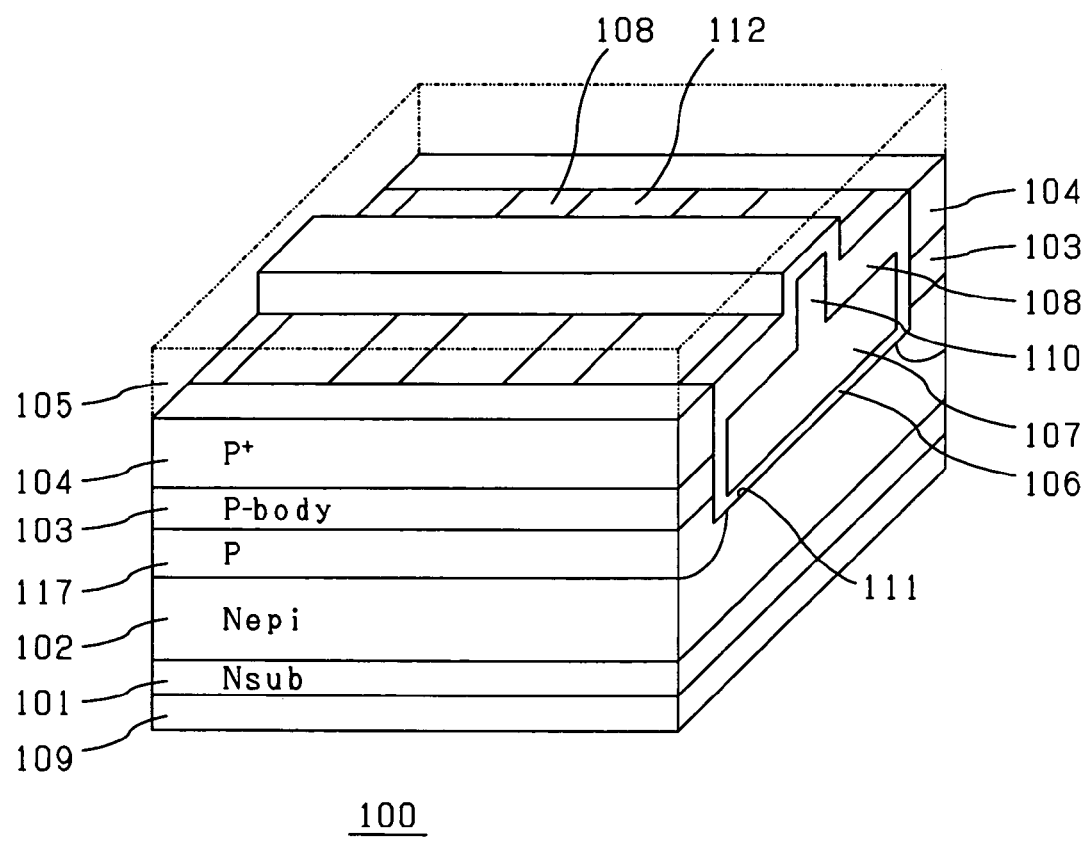
FIG. 5 is a perspective view of a semiconductor device according to a second embodiment of the present invention.

Next, a second embodiment of the present invention will be described. FIG. 5 is a perspective view of a semiconductor device according to the second embodiment of the present invention. In FIG. 5, the reference number 117 refers to a P type area for easing an electric field. The other reference numbers refer to the same components as those shown in FIG. 1.

A semiconductor device 100 according to the second embodiment of the present invention is one modification example of the semiconductor device 100 according to the first embodiment of the present invention. In other words, the P type area 117 for easing the electric field is added to the structure of the semiconductor device 100 shown in FIG. 1. Forming the P type area 117, for easing the electric field, increases the number of manufacturing processes of the semiconductor device 100. The semiconductor device 100, however, has the advantage that the P type area 117 for easing the electric field can ease the electric field intensity of the corners of the gate trenches 111 when reverse voltage is applied to the semiconductor device 100.

Figure 6:
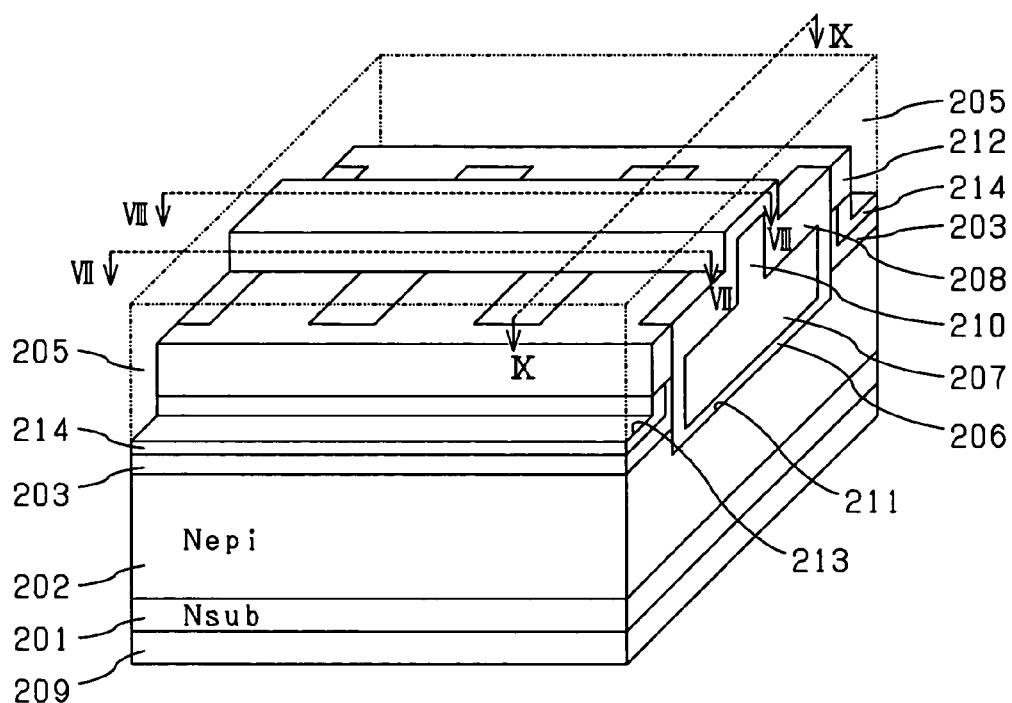
FIG. 6 is a perspective view of a semiconductor device according to a third embodiment of the present invention.
Figure 7:
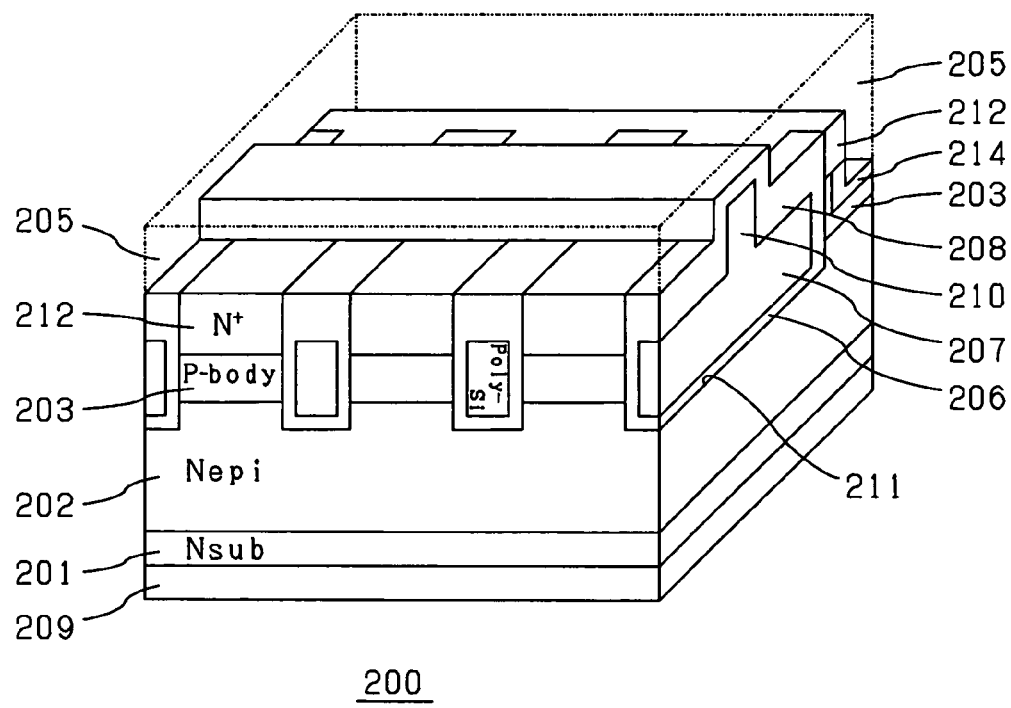
FIG. 7 is a sectional perspective view of the semiconductor device shown in FIG. 6 taken along the line VII—VII.

Next, a third embodiment of the present invention will be described. FIG. 6 is a perspective view of a semiconductor device according to the third embodiment of the present invention. In FIG. 6, a semiconductor device 200 comprises an N$^+$ type drain layer 201, an N$^-$ type drift layer 202, a P type body layer 203, a source electrode film 205, gate insulating films 206, gate electrode films 207, upper gate insulating films 208, a drain electrode film 209, upper gate electrode films 210, gate trenches 211, an N$^+$ type source area 212, source trenches 213, and embedded P$^+$ type diffusion areas 214. FIG. 7 is a sectional perspective view of the semiconductor device shown in FIG. 6 taken along the line VII—VII. In FIG. 7, all the reference numbers refer to the same components as those shown in FIG. 6.

In the semiconductor device 200 according to the third embodiment of the present invention, the structure of the source trenches is provided in the semiconductor device 100 according to the first embodiment. In other words, the source trenches 213 are formed separately from the gate trenches 211 in a direction orthogonal to the gate trenches 211. Furthermore, the embedded P$^+$ type diffusion areas 214 are formed instead of the P$^+$ type diffusion areas 104 of the semiconductor device 100. The embedded P$^+$ type diffusion area 214 is formed so as to be exposed from the bottom face and the side face in the vicinity of the bottom face of the source trench 213. The N$^+$ type source area 212 is formed over the embedded P$^+$ type diffusion areas 214. The N$^+$ type source area 212 is exposed from the side face of the source trench 213, except for a portion in the vicinity of the bottom face thereof. To form the embedded P$^+$ type diffusion area 214, P type impurities are injected from the bottom face of the source trench 213, and the impurities are diffused by applying high heat. The embedded P$^+$ type diffusion area 214, however, may be formed by another method. It is preferable that the N$^+$ type source area 212 be exposed in the foregoing range, but the N$^+$ type source area 212 can function if the N$^+$ type source area 212 is exposed on most of the bottom face of the source trench 213. Thus, it is possible to change the confines of formation in accordance with various conditions, such as the distance between the source trench 213 and the gate trench 211.

The source electrode film 205 is charged into the inside of the source trenches 213. (The source trenches 213 is filled with the source electrode film 205.) Accordingly, the embedded P+ type diffusion areas 214, the N+ type source area 212, and the source electrode film 205 are electrically connected inside the source trenches 213. Since the N+ type source area 212 is exposed in a portion other than the inside of the source trenches 213, as a matter of course, the N+ type source area 212 is electrically connected to the source electrode film 205 in this exposed portion.

As shown in FIG. 7, the structure of the mesa sections between the gate trenches 211 is almost the same as that of FIG. 2. Thus, the P type body layer 203 of uniform thickness is formed under the N+ type source area 212 in the mesa sections, and the P type body layer 203 is thinly formed below the source trenches 213 so as to surround the bottom of the embedded P+ type diffusion areas 214.

Figure 8:
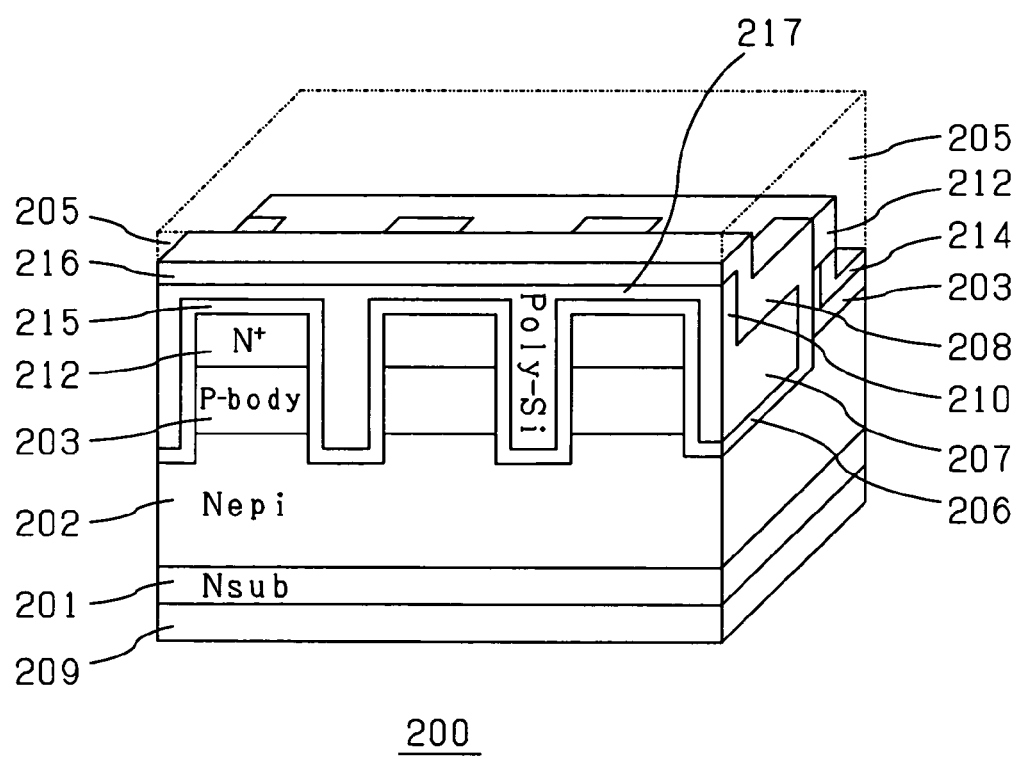
FIG. 8 is a sectional perspective view of the semiconductor device shown in FIG. 6 taken along the line VIII—VIII.
Figure 9:
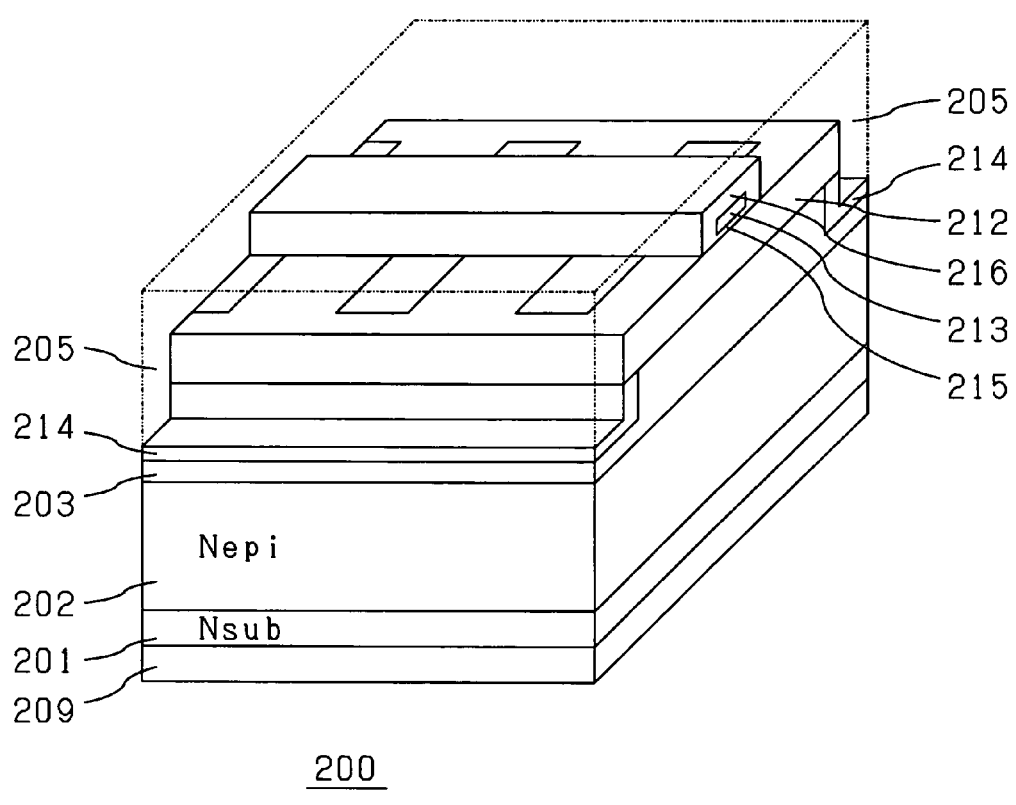
FIG. 9 is a sectional perspective view of the semiconductor device shown in FIG. 6 taken along the line IX—IX.

FIG. 8 is a sectional perspective view of the semiconductor device shown in FIG. 6 taken along the line VIII—VIII. In FIG. 8, the reference number 213 refers to a connection member, and the reference numbers 215 and 216 refer to interlayer insulating films. All the other reference numbers refer to the same components as those shown in FIG. 6. FIG. 9 is a sectional perspective view of the semiconductor device shown in FIG. 6 taken along the line IX—IX. All the reference numbers used in FIG. 9 refer to the same components as those shown in FIGS. 6 and 8. Referring to FIGS. 8 and 9, the structure of the connection member 213 of the semiconductor device 200, and the vicinity thereof, is almost the same as that of the semiconductor device 100. The resistivity and surface concentration of each conductive layer and conductive area are the same as those of the semiconductor device 100 according to the first embodiment.

Accordingly, in the semiconductor device 200, the source trenches 213 are formed, and the embedded P+ type diffusion areas 214 are exposed from the bottom faces and in the vicinity of the bottom faces of the source trenches 213. The structure of the semiconductor device 200 is more complicated than that of the semiconductor device 100, but there is the advantage that the miniaturization in the vicinity of such areas becomes easier by embedding the P+ type diffusion areas.

Also in the semiconductor device 200, it is possible to ease the electric field intensity of the corners of the gate trenches 211 by forming an area corresponding to the P type area 117 for easing the electric field as shown in FIG. 5.

The present invention is not limited to the embodiments described above. Variation of specific features related to, for example, the depth of the gate trench, and the like—are envisaged without departing from the scope of the present invention as defined in the claims.

The disclosure of Japanese Patent Application No. 2003-286356 filed on Aug. 5, 2003, including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A semiconductor device comprising:
   a first conductive layer of a first conductive type;
   a second conductive layer of the first conductive type laminated on the first conductive layer;
   a third conductive layer of a second conductive type opposite to the first conductive type, the third conductive layer being laminated on the second conductive layer;
   a fourth conductive layer of the first conductive type laminated on the third conductive layer;
   a plurality of first grooves formed so as to extend the second conductive layer through the third conductive layer;
   a plurality of second grooves formed so as to extend in a direction across the first grooves from the surface of the fourth conductive layer to the third conductive layer through the fourth conductive layer, separately from the first grooves;
   conductive areas of the second conductive type formed so as to be exposed from at least the bottom faces of the second grooves;
   first insulating films formed on the side faces and bottom face of the first groove;
   gate electrode films formed on the surfaces of the first insulating films;
   second insulating films formed on the gate electrode films;
   a conductive film connected to the gate electrode films so as to be across the first grooves;
   a third insulating film formed so as to cover the conductive film;
   a source electrode film formed at least on the surface of the fourth conductive layer, and on side faces and bottom faces of the second grooves;
   a drain electrode film formed on the surface of the first conductive layer; and
   a conductive area for easing an electric field, the conductive area being formed between the second conductive layer and the third conductive layer, so as to cover the corners of the first grooves.

2. The semiconductor device according to claim 1, wherein
   the gate electrode film is electrically connected to the adjacent different gate electrode film by a connection member, which is formed above the fourth conductive layer and is electrically insulated from the source electrode film.

3. The semiconductor device according to claim 2, wherein the connection member is electrically insulated from the source electrode film by gate insulating films.

4. A semiconductor device comprising:
   a first conductive layer of a first conductive type;
   a second conductive layer of the first conductive type laminated on the first conductive layer;
   a third conductive layer of a second conductive type opposite to the first conductive type, the third conductive layer being laminated on the second conductive layer;
   a fourth conductive layer of the first conductive type laminated on the third conductive layer;
   a plurality of grooves formed in parallel with each other so as to extend from the surface of the fourth conductive layer to the second conductive layer through the fourth and third conductive layers;
   a plurality of conductive areas of the second conductive type formed on the third conductive layer in a direction across the grooves in the shape of a strip so as to make contact with end portions of the fourth conductive area and the groove;

first insulating films formed on the side faces and bottom face of each of the grooves;

gate electrode films formed on the surfaces of the first insulating films;

second insulating films formed on the gate electrode films;

a conductive film connected to the gate electrode films so as to be across the grooves;

a third insulating film formed so as to cover the conductive film;

a source electrode film formed on the surfaces of at least the fourth conductive layer and the conductive areas;

a drain electrode film formed on the surface of the first conductive layer; and a conductive area for easing an electric field, the conductive area being formed between the second conductive layer and the third conductive layer, so as to cover the corners of the grooves.

5. The semiconductor device according to claim 1, wherein the gate electrode film is electrically connected to the adjacent different gate electrode film by a connection member, which is formed above the fourth conductive layer and is electrically insulated from the source electrode film.

6. The semiconductor device according to claim 5, wherein the connection member is electrically insulated from the source electrode film by gate insulating films.

* * * * *